(12) United States Patent
Pontius et al.

(10) Patent No.: US 6,507,887 B1
(45) Date of Patent: Jan. 14, 2003

(54) BINARY DATA MEMORY DESIGN WITH DATA STORED IN LOW-POWER SENSE

(75) Inventors: Timothy A. Pontius, Lake in the Hills, IL (US); Gregory E. Ehmann, Sleepy Hollow, IL (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/551,087

(22) Filed: Apr. 18, 2000

Related U.S. Application Data

(63) Continuation of application No. 09/006,404, filed on Jan. 13, 1998.

(51) Int. Cl.$^7$ ............................................. G06F 12/00
(52) U.S. Cl. ........................ 711/102; 711/104; 711/170
(58) Field of Search ................................ 711/103, 102, 711/104, 170, 105; 326/40; 365/105, 49, 185.21, 203, 230.06, 233.5

(56) References Cited

U.S. PATENT DOCUMENTS

| | | | | |
|---|---|---|---|---|
| 4,672,576 A | * | 6/1987 | Davis | 365/105 |
| 5,250,859 A | * | 10/1993 | Kaplinsky | 326/40 |
| 5,526,322 A | * | 6/1996 | Lee | 365/233.5 |
| 5,581,500 A | * | 12/1996 | D'Souza | 365/156 |
| 5,617,348 A | * | 4/1997 | Maguire | 365/49 |
| 5,708,603 A | * | 1/1998 | Tanaka | 365/185.21 |
| 5,808,956 A | * | 9/1998 | Maruyama | 365/230.06 |
| 5,828,610 A | * | 10/1998 | Rogers et al. | 365/203 |
| 5,873,112 A | * | 2/1999 | Norman | 711/103 |

* cited by examiner

*Primary Examiner*—David Hudspeth
*Assistant Examiner*—Fred F. Tzeng
(74) *Attorney, Agent, or Firm*—Peter Zawilski

(57) ABSTRACT

A method of designing a mask-programmable random-access read-only memory device begins with a step of assigning weightings to addresses according to their expected frequency of access. These weighting are used in a second step of determining for each sense amplifier, what is the low-power sense (inverted or uninverted) of the stored bits using that sense amplifier as an output. The third step involves storing the data in the low-power sense. The fourth step involves inverting the outputs for the data that is stored inverted. This can involve using sense inverting sense amplifiers for inverted data and sense preserving amplifiers for uninverted data. The method can result in memories in which some outputs are sense inverting while others are sense preserving. The result is a memory device with reduced power consumption relative to a comparable design not taking advantage of the relationship between data values and power consumption.

10 Claims, 2 Drawing Sheets

BINARY DATA MEMORY DESIGN WITH DATA STORED IN LOW-POWER SENSE

This is a continuation of copending U.S. patent application Ser. No. 09/006,404, filed Jan. 13, 1998.

The present invention relates to data processing and, more particularly, to memories used in data processing systems. A major objective of the invention is to reduce power consumption by a computer memory and thus by an incorporating data processing system.

Much of modern progress is associated with the evolution of computers. A typical computer comprises a processor for processing data by executing instructions, memory for storing instructions and data, and various interface devices. Early computers were room-sized and required dedicated cooling systems to remove the heat generated by the power they dissipated. Advances in integrated circuit technology have provided ever-more powerful data processing systems that are smaller and consume less power than their predecessors.

Even though power requirements have decreased by orders of magnitude, power consumption remains a major concern. This is most apparent in battery-powered portable devices. People often carry extra batteries, AC adapters, and battery rechargers to ensure against a loss of functionality. Having to carry these accessories and supplies decreases the convenience of the portable devices. The need to carry extra batteries and power accessories can be obviated in part by using larger (or more) batteries, but this increases device bulk and thus decreases portability.

Reducing power requirements allows the use of smaller batteries and/or decreases the frequency with which batteries must be replaced or recharged. Using smaller batteries decreases device bulk. Reducing frequency of replacement reduces the financial and environmental cost of device ownership. Reducing the frequency of recharging extends battery life and makes it more practical to leave power accessories behind. In some cases, lower power requirements increase the viability of solar power to replace or supplement battery power, further enhancing the portability. Reducing power consumption also reduces heat dissipation, so that less bulk needs to be dedicated to removing heat from a device.

There are many approaches to reducing power requirements. Advances in semiconductor manufacturing have permitted smaller and more power efficient circuits. Advances in circuit design and processor architecture have also reduced power requirements. Such advances have reduced power requirements across all types of devices including processors, memories, and interface devices.

In addition to these hardware-oriented approaches, there are software-oriented approaches to reducing power requirements. Considerable effort has been invested in designing instruction sets and data formats for efficient use of available capacities for computation, storage and communication. As these capacities are used more efficiently, power requirements are reduced. However, as dramatic as power reductions have been to date, further reductions are desired to increase portability and convenience, reduce environmental and financial costs, and achieve other objectives.

SUMMARY OF THE INVENTION

The present invention provides a random-access binary memory design in which the sense (inverted vs. uninverted) in which data is stored and a low-power sense of the memory output are matched. For many types of memories, the power consumed as a bit of data is output depends on the value of that bit. For example, memories based on prevalent n-type insulated-gate field-effect transistor (n-type IGFET, also known as "NMOS") technology typically apply an active high precharge to memory bit lines (to take advantage of the fact that NMOS transistors can effect downward transitions faster than upward transitions) and, therefore, consume less power when outputting a "1" than when outputting a "0". In the case that the data to be stored contains more 0s than 1s, the present invention provides for storing the data in inverted form and then inverting the output. The invention has clearest applicability to read-only memories, but can be applied to various types of rewrittable memories.

The invention can be applied in a unitary manner to all data stored in a device. If the data to be stored is, overall, already in the low-power sense (e.g., mostly 1s), then the result is a device with data stored in its uninverted sense. If the data to be stored is, overall, in the high-power sense, the invention provides for storing the data in its inverted sense and then inverting the device output.

The advantage of the invention is greatest where the numbers of 1s and 0s stored are very different, i.e., the distribution of 1s and 0s is unbalanced. Even if the 1s and 0s are balanced overall, the invention can provide an advantage where there are local imbalances between the 1s and 0s. For example, the invention can be applied independently to each device output to achieve, in general, a greater power reduction than could be achieved by treating the device in a unitary manner.

Further reductions in power consumption are achievable in some cases by further subdividing the stored bits. A practical implementation groups bits connected to a common sense amplifier. If the data is to be inverted, then the sense amplifier can be sense inverting instead of sense preserving (or vice versa). In embodiments where the invention is not applied in a unitary manner across a device, it is possible for a device to have some inverting outputs (at either the block or device level) and some sense-preserving outputs (again, at either the block or device level).

In some embodiments, output inversion is effected by inverters external to the integrated circuit storing the data. However, it is preferable that the inversion be built into the device, e.g., as sense-inverting sense amplifiers. Alternative embodiments achieve the inversion internally by inverting the precharge (or "pre-bias") sense (e.g., using p-type field-effect transistors and a low precharge level) as a function of the overall sense of the data, rather than the other way around.

Data weighting is provided for by the present invention. For example, some memory addresses are accessed much more frequently than others. In that case, the more frequently accessed data can be given greater weight than less frequently accessed data. Of course, it may be difficult to determine precisely the frequency with which data will be accessed. Nonetheless, even rough predictions can be helpful in optimizing a design for minimum power consumption.

The present invention provides for reduced power consumption for memory devices, and thus of incorporating systems. This data based approach to saving power is compatible with most other approaches to conserving power, including data compression and other non-data related approaches. Accordingly, the present invention provides for a power reduction that is cumulative to that provided by other approaches. Thus, devices with less bulk and/or longer periods between recharging and/or battery replacement are made possible. This extends the range of devices that can be made portable and increase the convenience of device types

DESCRIPTION OF THE PREFERRED EMBODIMENTS

Figure 1:
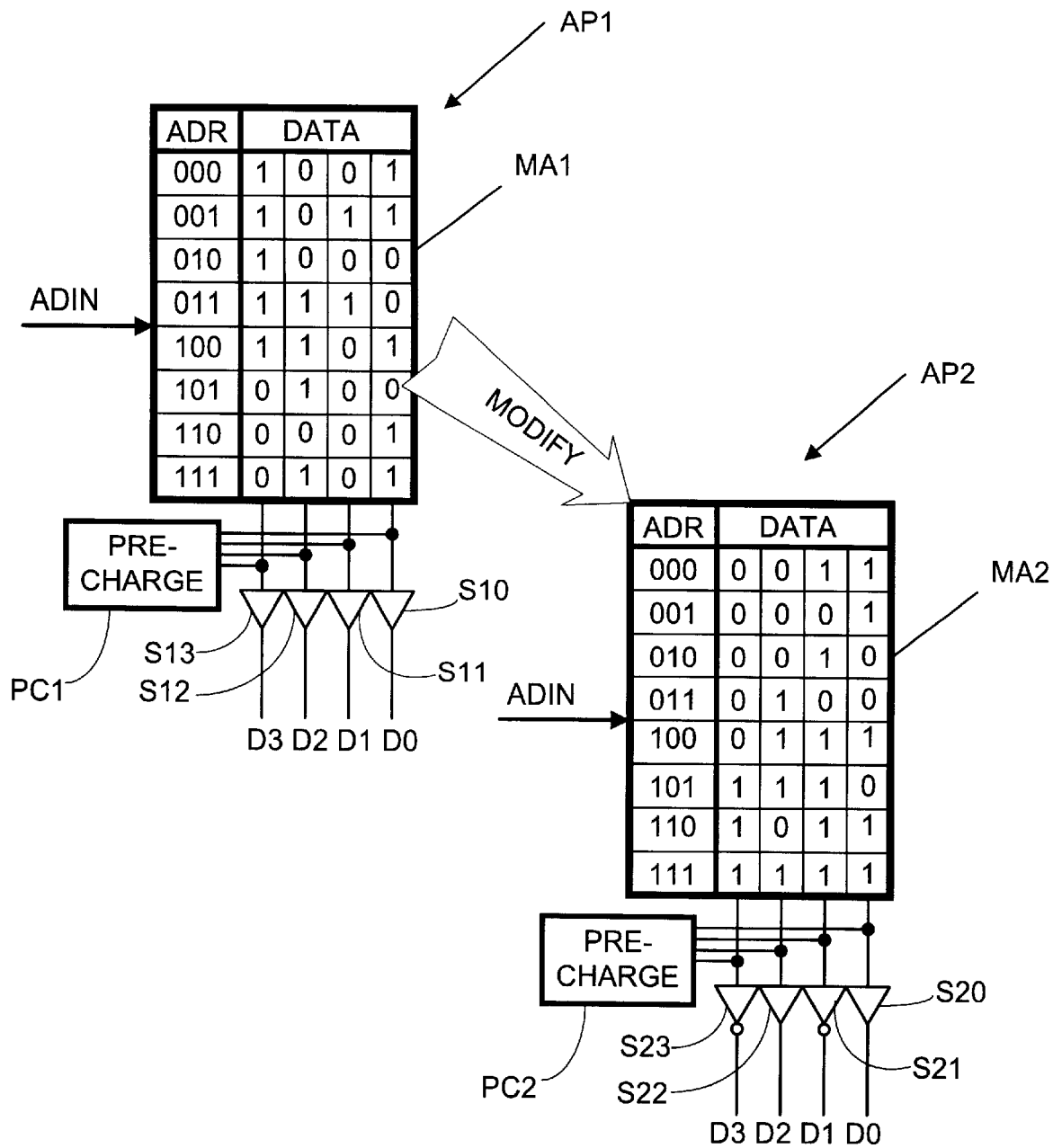
FIG. 1 is a schematic diagram indicating the starting and ending points of a method in accordance with the present invention.

As shown in FIG. 1, mask-programmable random-access read-only memories AP1 and AP2 are, respectively, "before" and "after" depictions of a design modification in accordance with the present invention. Memory AP1 is a conventional 8×4-bit random access read-only memory. It includes a memory array MA1 with eight storage locations, each of which holds a 4-bit string of binary data. Each of the eight storage locations has a respective 3-bit address (ADR) 000, 001, 010, 011, 100, 101, 110, 111.

When a 3-bit address is received from a microprocessor at address input ADIN, memory AP1 outputs the four bits stored at that location.

For example, if the address 000 is received, 1001 is output. Each of the four bits of the output is provided to a respective sense amplifier S10–S13. Each of these sense amplifiers is sense preserving so that the desired data is read out as desired at outputs D0–D4.

A precharge circuit PC1 precharges the inputs to sense amplifiers S10–S13 to a voltage-high state. The precharge ensures the fastest read times for memory AP1, which is an NMOS device. When a 0 is output to a sense amplifier, the precharge is sunk. The resulting current is associated with a substantial consumption of power. Significantly less power is consumed when a 1 is output and the voltage at the sense amplifier input is unchanged. Thus, power consumption is a function of data output. However, memory AP1 does not take optimal advantage of this fact.

The invention provides for modifying the design of memory AP1 to yield the design of memory AP2. Memory AP2 comprises a memory array MA2, a precharge circuit PC2, and four sense amplifiers S20–S23. Memory array MA2 is similar to memory array MA1 except for the data contents. Precharge circuit PC2 is similar to precharge circuit PC1. Sense amplifiers S20–S23 are similar to sense amplifiers S10–A13 except that sense amplifiers S21 and S23 are sense inverting instead of sense preserving. The reasons for the differences are presented below.

Each sense amplifier S20–S23 serves to output the value of a respective bit position of a string accessed by a corresponding address to memory AP2. Sense amplifier S20 outputs the least significant (rightmost) bit of the addressed string. Note that, for each address, the value of the least significant bit is the same for both memories AP1 and AP2. This means that the column of data in the least significant bit positions of memory AP2 is not inverted. The least significant column of data memory AP1 includes five 1s and three 0s, so the low-power sense predominates. Therefore, there is nothing to be gained by inverting the least significant column of data as it is expressed in memory AP2.

A more refined modification can result when the memory storage locations are weighted for the purpose of determining the low power sense. In the illustrative case, it is estimated that the four addresses beginning with 1, e.g., 100, 101, 110, and 111 are accessed three times as frequently as the addresses beginning with 0, e.g., 000, 001, 010, and 011. Accordingly, the 1xx addresses are given thrice the weight as the 0xx addresses. The weighted average data value for the least significant column of memory AP1 is $11/16$ or about 0.69 which is greater than one-half, the upper threshold for inverting the data values. Thus, with or without weighting, the least significant column of memory AP2 matches the least significant column of memory AP1; accordingly, sense amplifier S20 is sense preserving.

The second-least significant column of data, associated with sense amplifier S11 of memory AP1, includes two 1s and six 0s for an average value of 0.25. With weighting, the average value is 0.125. Accordingly, the high-power sense predominates. A reduction in power consumption is achieved by inverting the second-least significant column of data in memory AP2. Concomitantly, sense amplifier S21 is sense inverting.

The third-least significant column of data, associated with sense amplifier S12 of memory AP1 includes four 0s and four 1s. If weighting is not taken into account, it does not matter whether or not this column of data is inverted in memory AP2. However, the weighted average value for this column is $10/16$ or 0.675. Thus, the low-power sense is favored. Accordingly, the corresponding third-least significant column is not inverted in memory AP2, and sense amplifier S22 is sense preserving.

The most significant column of data in memory AP1 has five 1s and three 0s, suggesting that the low-power sense predominates. However, the weighted average is $7/16$ or about 0.44 so the high-power sense predominates. Thus, the most significant column of data in memory AP2 is inverted and inverter S23 is sense inverting.

The most significant column represents the relatively infrequent case in which the low power sense dominates numerically, but not after weighting. It can be noted that in memory AP2, the low-power sense predominates numerically overall; specifically, memory AP2 stores eighteen 1s and fourteen 0s. This $18/14$ (corresponding to about 0.56) numerical dominance of the low-power value is an increase over the $16/16$ (corresponding to 0.5) split of memory AP1; this differential serves as a rough indicator of the power savings afforded by the present invention. A more precise measure takes weightings into account: for the illustrated data with a 3:1 weighting the ratios are about 0.47 not using design method M1 and about 0.69 using method M1.

A less sophisticated implementation of the invention would consider the distribution of low power and high power values over the device as a whole. Since the split is even in memory AP1, an unweighted count of high-power and low-power values would not be determinative of whether all data should be inverted or remain uninverted. A weighted determination would indicate that a slight reduction in power consumption could be achieved by inverting the data. However, the reduction is less than achieved by the column-by-column determination employed as illustrated in FIG. 1.

Figure 2:
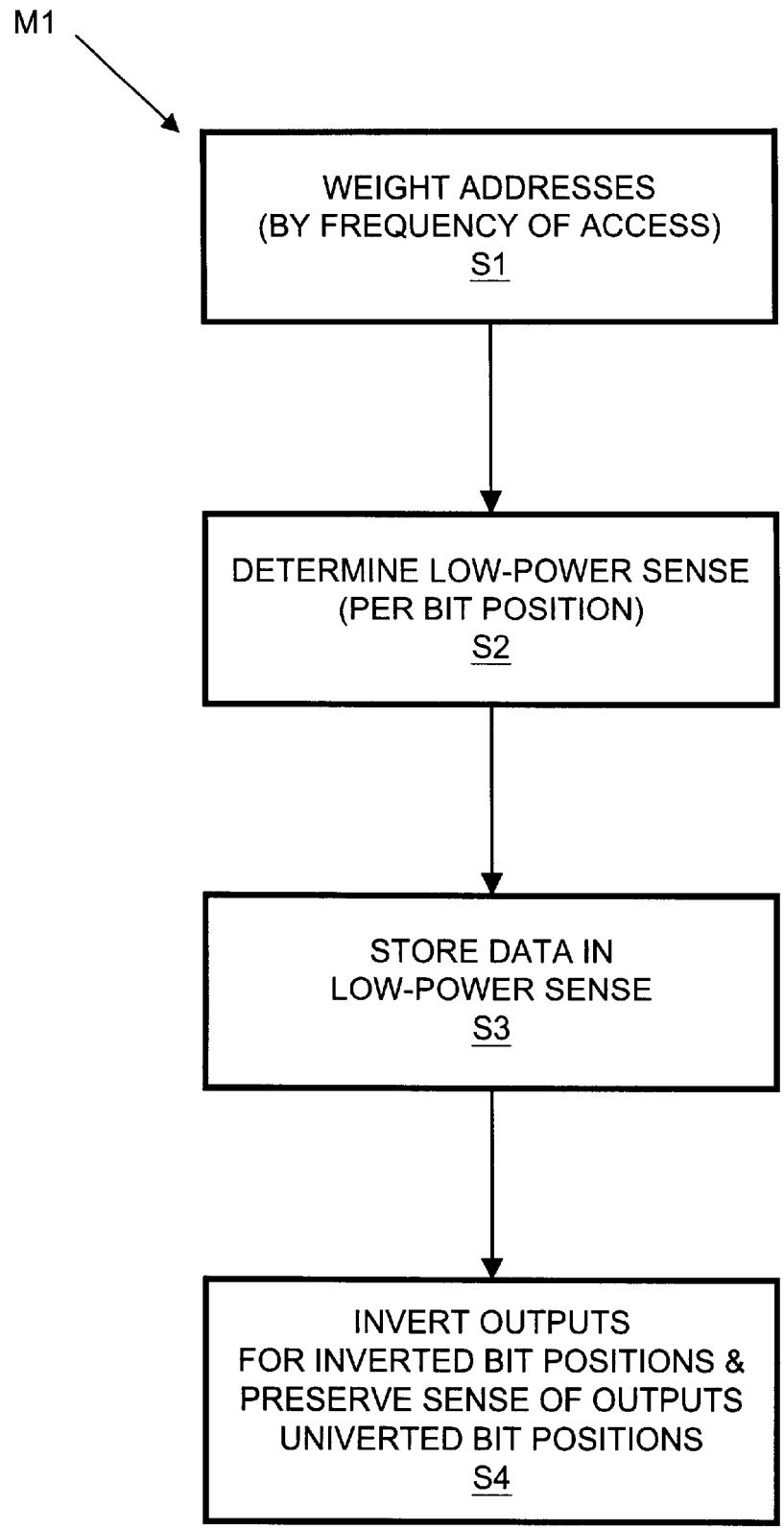
FIG. 2 is a flow chart of the method used to make the modification depicted in FIG. 1.

The method M1 of the invention that determined the modification illustrated in FIG. 1 is flow charted in FIG. 2. The first step S1 involves assigning weightings to string storage locations (addresses). This step is considered optional in that reductions in power consumption can be achieved even where this step is omitted. However, the reductions can be more certain and larger where step S1 is employed.

Power reduction is enhanced where the weightings correspond closely with access frequencies of the storage locations. Accordingly, the weightings should correlate closely with some measure of relative expected frequency of access. This metric can be estimated by a priori knowledge of how the stored data is used, by simulation, or by empirical tests. A prior knowledge can involve a recognition that some address are involved in instruction loops while others are not. For another example, some addresses might be used only when power is applied to an incorporating system, while other addresses might be accessed many times during a power-on session. As long as the weightings correspond more closely to reality than a lack of weightings, an advantage in power reduction can be achieved with step S1.

The invention provides for the use of factors in addition to or instead of expected frequency of access. For example, power conservation may be more important in some circumstances than in others. These circumstances may correlate with access of certain addresses. These correlations can be taken into account in the weightings. Likewise, any power-consumption or other cost associated with inverting outputs can be reflected in the weightings. For example, if external inverters must be added, the determination of whether or not to invert can be weighted against inverting.

Step S2 involves determining the low-power sense for the data (or, in an alternative embodiment, for the precharge). If step S1 has provided a weighting, this weighting is used in step S2; otherwise, step S2 can provide the determination without weighting. Step S2 can be applied in a unitary manner across an entire memory device. Preferably, it is applied independently to each group of bits serviced by a common sense amplifier. In general, bits within a group have the same bit position within the memory. Depending on the memory architecture, the bits can be in the same column or in the same group of columns serviced by that sense amplifier.

Step S3 involves storing the data in the memory in the low-power sense. Depending on how step S2 is implemented, the sense in which the data is stored can be the same for the entire device or vary by column or groups of columns. The mechanics of data storage varies according to the type of memory. If the memory is a mask-programmable read-only memory, the data is stored during manufacture. If memory is a programmable read-only memory, the data can be stored upon programming. If the memory is a rewritable memory (e.g., RAM), the data can be written.

Step S4 involves inverting the outputs for bits stored in an inverted sense and preserving the sense of the outputs for which the bits are stored in their uninverted sense. The details of output sense implementation depend of the type of memory. In the case of a mask-programmable ROM, the sense of sense amplifiers can be determined during manufacture. For programmable ROMs external inverters can be used or programmable sense amplifiers or inverters can be incorporated into the programmable device. For rewritable memories, programmable sense amplifiers can be put under control of a memory management unit.

In the illustrated embodiment, the memory is a 8×4-bit memory. However, memories of other dimensions are provided for. Different widths, depths, and architectures are provided for. In the case of block memory architectures, the correspondence between columns and bit positions can be many to one. In such cases, it can be most practical to apply the invention on a per sense amplifier basis. The memory device can be used for many purposes. For example, it can include boot and/or other instructions. Where it includes both, the other (e.g., operating) instructions might be given greater weight than the boot instructions (which are accessed only once per session). Other variations upon and modifications to the illustrated embodiments are provided for by the present invention, the scope of which is limited only by the following claims.

What is claimed is:

1. A read-only random-access memory design method comprising:

determining a low-power sense for binary data having bit values;

storing said data in said low-power sense in a row-addressable memory array having rows and columns, each of said bit values being stored at a respective row and a respective column, said data being stored so that all bit values stored in a first column are inverted and all bit values stored in a second column are not inverted; and inverting data output from one of said first and second columns and not inverting data output from the other of said columns.

2. A method as recited in claim 1 wherein said determining and storing steps are performed for each column independently of the other columns.

3. A method as recited in claim 1 further comprising a preliminary step of weighting rows of said memory, said determining step applying the weightings assigned in said preliminary step to determine which of said columns is to have inverted bit values.

4. A method as recited in claim 3 wherein said preliminary step involves weighting addresses as a function of expected frequency of access.

5. A random access memory resulting from the method of claim 1.

6. A read-only random access memory comprising:

plural bit-value storage locations arranged in an array with rows and columns, each of said rows having an address;

an address input for receiving said addresses; and a data output for outputting bit values stored in a row when its address is received by said address input, said data output including means for inverting some but not all of the bit values of said row.

7. A random access memory as recited in claim 6 further comprising bias means for pre-biasing said data output to the sense corresponding to a majority of the bit values stored in said array.

8. A random access memory as recited in claim 6 wherein said rows have associated weightings.

9. A random access memory as recited in claim 8 further comprising pre-charge means for pre-biasing said data output to the sense corresponding to a weighted majority of the bit values stored in said array, said weighted majority being a function in part of said weightings.

10. A random access memory as recited in claim 6 wherein said data output includes programmable sense amplifiers.

* * * * *